United States Patent
Pan et al.

(10) Patent No.: US 8,849,883 B2
(45) Date of Patent: Sep. 30, 2014

(54) METHOD AND APPARATUS FOR ADAPTIVE CONTROL OF THE DECIMATION RATIO IN ASYNCHRONOUS SAMPLE RATE CONVERTERS

(75) Inventors: Yang Pan, Shanghai (CN); David Lamb, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 739 days.

(21) Appl. No.: 13/069,622

(22) Filed: Mar. 23, 2011

(65) Prior Publication Data

US 2012/0246210 A1    Sep. 27, 2012

(51) Int. Cl.
*G06F 17/17* (2006.01)
*H03H 17/06* (2006.01)

(52) U.S. Cl.
CPC .................................. *H03H 17/0628* (2013.01)

USPC .......................................... 708/313; 708/300

(58) Field of Classification Search
None
See application file for complete search history.

(56) References Cited

U.S. PATENT DOCUMENTS 5,475,628 A * 12/1995 Adams et al. ................. 708/313

* cited by examiner

*Primary Examiner* — Michael D Yaary
(74) *Attorney, Agent, or Firm* — Kenyon & Kenyon, LLP

(57) ABSTRACT

An asynchronous sample rate converter prevents the folding back of a signal in the passband of an input sample rate into the passband of the output sample by adaptively controlling the decimation rate. The ASRC includes an adaptive decimation rate controller that selectably controls a decimation filter based on the ratio of the input sampling rate to the output sampling rate. By adaptively controlling the decimation rate in the ASRC, a significant amount of area and power is saved.

21 Claims, 3 Drawing Sheets

US 8,849,883 B2

METHOD AND APPARATUS FOR ADAPTIVE CONTROL OF THE DECIMATION RATIO IN ASYNCHRONOUS SAMPLE RATE CONVERTERS

FIELD OF THE INVENTION

The present invention relates to asynchronous sample rate converters for audio applications. The present invention further relates to adaptive decimative filters in an asynchronous sample rate converter with a variable sample rate. The present invention further relates to a method for adaptive controlling of the downsampling ratio of the decimating filter in an asynchronous sample rate converter.

BACKGROUND INFORMATION

The expansion of the portable audio market has led to an increase in the complexity of these portable audio devices. In providing users with an influx of new features, these portable devices can provide benefits beyond just simply allowing a user to listen to recorded audio when mobile. Compatibility among the portable audio devices and various components can often be difficult since most audio sources operate at distinctly different sample rates.

Digital asynchronous sample rate converters ("ASRCs") were manufactured to rectify the disparity between the different sample rates of the audio devices. FIG. 1 illustrates a standard design of a digital ASRC. During operation, ASRC 10 receives an input signal, $D_{in}$, at an initial sample rate of $Fs_{in}$. ASRC 10 interpolates $D_{in}$ with interpolator 20 by an interpolation ratio, U, resulting in a high sample rate, $U*Fs_{in}$ of the input signal. Interpolator 20 outputs the interpolated signal to a low pass filter 30. Low pass filter 30 is used to remove any present images that were generated by the interpolation of the input signal. The low pass filter 30 outputs the filtered signal to a decimation filter 40. Decimation filters are primarily used to lower the sampling rate of a given input, and decimation filter 40 can downsample the filtered signal by a determined downsampling rate, D, resulting in an output of the input signal with a sampling rate $Fs_{out}$ according to Equation (i):

$$Fs_{out} = (U/D)*Fs_{in} \quad (i)$$

One of the problems that may be raised with existing digital ASRCs is the possibility that the output sampling rate is lower than the input sampling rate, namely $Fs_{out} < Fs_{in}$. This may occur for a number of reasons, including if the downsampling rate is greater than the interpolation ratio, as demonstrated by equation (i). In instances in which this may occur, some signal in the passband of $Fs_{in}$ folds back as noise into the passband for $Fs_{out}$. Previous ASRC systems have attempted to correct this issue by increasing the order of the low pass filter. Systems that use this technique increase the order of the low pass filter to provide for a sufficient amount of attenuation for the signal in the passband of $Fs_{in}$ that otherwise would have folded back as noise. The implementation of these systems requires a large amount of area, an increase in die size for the larger low pass filter, and additional logic needed to implement this system, which is not cost effective.

Other previously designed ARSCs have used other techniques to avoid the signal in the passband of $Fs_{in}$ folding back as noise into the $Fs_{out}$ passband. U.S. Pat. No. 6,834,292 ("the '292 patent") describes a system where the input sampling rate is not directly converted to the output sampling rate. FIG. 2 illustrates an ARSC similar to the system used in the '292 patent. In FIG. 2, instead of outputting $Fs_{out}$, ASRC 10 outputs a temporary sampling rate. This temporary sampling rate data is represented by $S*Fs_{out}$, where S is a fixed constant. The temporary sampling rate is output from ASRC 10 to an external decimation filter 50. Decimation filter 50 decimates the temporary sampling data, $S*Fs_{out}$, by the fixed constant S. This subsequently outputs the real output sampling rate, $Fs_{out}$. By using a temporary sampling rate output, in instances where $Fs_{in} > Fs_{out}$, decimation filter 50 provides enough attenuation for the $Fs_{out}$ passband. The system implemented in FIG. 2 does not have to increase the order of the low pass filter or store a large amount of input data. However, this system has a number of significant drawbacks that make it undesirable.

One of the problems is that the system implemented in FIG. 2 and the '292 patent have an ASRC that no longer produces the output sampling rate ($Fs_{out}$) as its output, but instead outputs $S*Fs_{out}$. This is significantly larger than the maximum allowable output sample rate for $Fs_{out}$. Since a determination of the interpolation ratio is based on the maximum allowable output sample rate and a desired bit accuracy, an ASRC that produces $S*Fs_{out}$ as an output would need to increase the interpolation ratio to maintain a desired bit accuracy. An increase in the interpolation ratio would necessitate an increase in the area of the chip, and lead to an increase in the power consumed by the system.

Thus there remains a need in the art for an efficient and cost-effective asynchronous sample rate converter that prevents a signal in the passband of $Fs_{in}$ from folding back as noise into the passband for $Fs_{out}$, without increasing the order of the low pass filter or the interpolation ratio. There further remains a need in the art for a designed system to decrease area and decrease power consumption during operation.

DETAILED DESCRIPTION

The subject invention will now be described in detail for specific preferred embodiments of the invention, it being understood that these embodiments are intended only as illustrative examples and the invention is not to be limited thereto.

In asynchronous sample rate converters, prevention of the folding back of a signal in the passband of an input sample rate into the passband of the output sample may be done by adaptively controlling the decimation rate in the ASRC. Embodiments of the present invention may provide a fixed multi-stage interpolator, a rate converter with a linear interpolator, an adaptive decimation rate controller, and a multi-stage decimator. The adaptive decimation rate controller and the multi-stage decimator may output an adaptive decimation rate that is dependent on the ratio of the input sampling rate to the output sampling rate. Adaptively controlling the decimation rate may assist in limiting a temporary sample rate to being equal to or lower than the output sampling rate ($Fs_{out}$), maintaining the performance of the low pass filter (without increasing the order). Embodiments of the present invention may allow for a decimation rate that is not exorbitantly high, which may allow for a reduction in the order of the decimation. In instances when $Fs_{in}<Fs_{out}$, embodiments of the present invention may provide for bypassing the decimation filter to save on power consumption.

Figure 1:
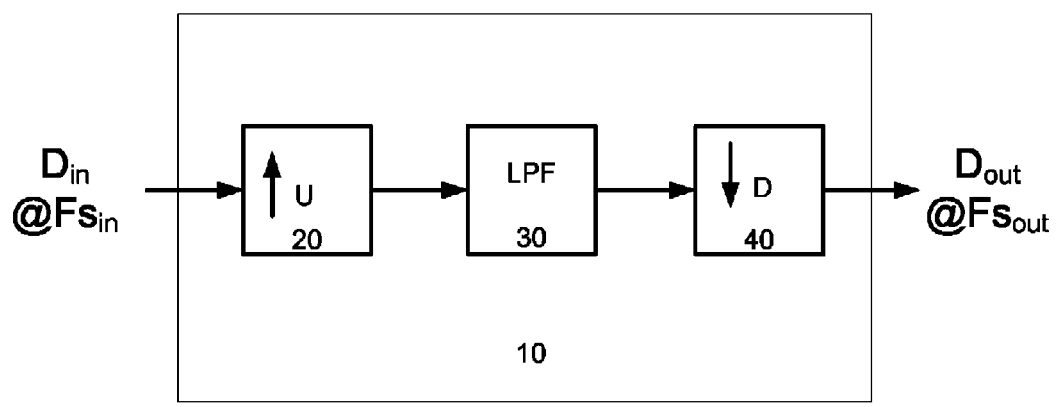
FIG. 1 is a diagram of a standard digital asynchronous sample rate converter.
Figure 2:
FIG. 2 is a diagram of a digital asynchronous sample rate converter using a fixed external decimation filter.
Figure 3:
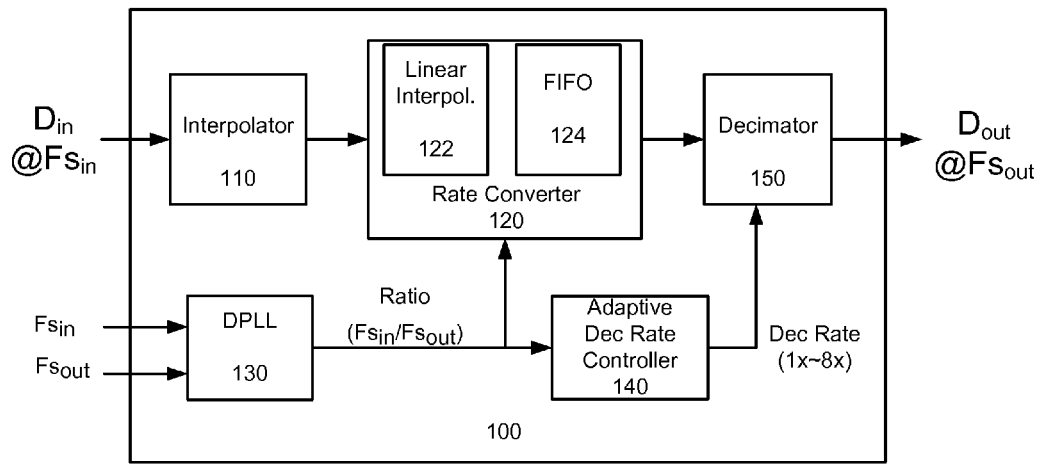
FIG. 3 is a diagram of an asynchronous sample rate converter with an adaptive decimation rate controller, according to the present invention.

FIG. 3 illustrates a diagram of an asynchronous synchronous sample rate converter with an adaptive decimation rate controller of the present invention. In an embodiment, the accuracy of ASRC 100 may be configured to be 20 bits. An input signal, $D_{in}$, may be received by ASRC 100 at a given input sample rate, $Fs_{in}$. ASRC 100 may include a digital phase-locked loop ("DPLL") 130. DPLL 130 may be used to determine the ratio between $Fs_{in}$ and an output sampling rate, $Fs_{out}$. DPLL 130 may receive the input sampling rate and the output sampling rate as inputs, and may output the ratio of $Fs_{in}$ to $Fs_{out}$ to rate converter 120 and adaptive decimation rate controller 140.

The input signal may be received by interpolation filter 110, which may also be situated in ASRC 100. In an embodiment, interpolation filter 110 may be a finite impulse response ("FIR") filter. In other embodiments, interpolation filter 110 may be another type of filter such as an infinite impulse response filter ("IIR"). In an embodiment, interpolation filter 110 may have an interpolation ratio of 128, which means the input signal may be upsampled to a temporary rate that is 128 times the input sampling rate ($Fs_{in}$).

In an embodiment, interpolation filter 110 may be designed as a multi-stage filter. Interpolation filter 110 may be constructed with a halfband ("HB") filter stage and a cascaded integrator-comb ("CIC") filter stage which may help optimize multi-rate processing. The use of the halfband filter and the cascaded integrator-comb filter may increase architectural and computational efficiency of the interpolation filter.

Interpolation filter 110 may have various coefficients, or tap weights, comprising the impulse response of the filter. Coefficients may be represented by a canonical signed-digit ("CSD") numeric implementation. In an embodiment, each coefficient of interpolation filter 110 may be represented as a 6-bit CSD code to avoid multipliers. Using 6-bit CSD code coefficients, may necessitate a higher static random access memory ("SRAM") for interpolation filter 110 to store the input data and the temporary interpolation result of the interpolation filter.

ASRC 100 may also contain rate converter 120. Rate converter 120 may receive the interpolated temporary result from interpolation filter 110 and convert the result into an output that is approximate 1 to 8 times $Fs_{out}$ at the output of the rate converter. Rate converter 120 may also receive the computed ratio of $Fs_{in}/Fs_{out}$ from DPLL 130. Rate converter 120 may include a linear interpolation filter 124. Linear interpolation filter 124 may have an interpolation ratio of 512, which means the temporary result output by linear interpolation filter 110 may be upsampled at a rate of 512 times the temporary result. This may result in a new interpolated temporary result that is that is $2^{16}$ times the input sampling rate, $Fs_{in}$ ($128*512=2^{16}$).

In an example embodiment, it may not be necessary for all of the 128 data points output by interpolation filter 110 to be upsampled by linear interpolation filter 124. When linear interpolation filter 124 receives the temporary result from the interpolation filter 110, linear interpolation filter 124 may use the latest two outputs from the CIC stage of interpolation filter 110 to calculate an output sample, which may represent a "virtual" interpolation by linear interpolation filter 124. This "virtual" interpolation may occur when a counter identifies an integer part of the CIC stage using the $Fs_{in}/Fs_{out}$ ratio output by DPLL 130.

Rate converter 120 may also include a FIFO block 124. FIFO 124 may be used to facilitate the asynchronous sample rate change, and using the ratio determined by DPLL 130, may convert the temporary result from of $2^{16}*Fs_{in}$ to an output that is no more than 8 times the output sampling rate ($Fs_{out}\leq$FIFO output$\leq 8*Fs_{out}$). An auto-protection scheme may remove any offset of the ratio used by the CIC stage of interpolation filter 110 and the ratio output by DPLL 130 to avoid collision of the write and read pointer of FIFO 124. FIFO 124 may output $D_{in}$ to decimation filter 150 at four distinct sampling rates: $Fs_{out}$, $2*Fs_{out}$, $4*Fs_{out}$, and $8*Fs_{out}$.

Figure 4:
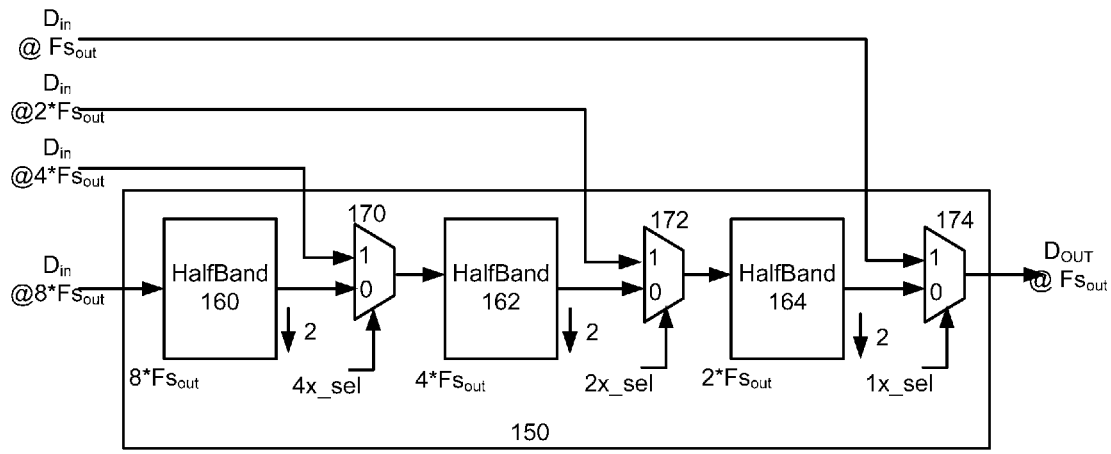
FIG. 4 is a diagram of the decimation filter of the asynchronous sample rate converter, according to the present invention.

ASRC may include a decimation filter 150. FIG. 4 illustrates a portion of the schematic of decimation filter 150. In one embodiment, decimation filter 150 may be a FIR filter. In other embodiments, decimation filter 150 may be another type of filter, such as an IIR filter. Decimation filter 150 may be configured with a 1-2-4-8× decimation engine which receives $D_{in}$ from rate converter 120 at the four designated sampling rates: $Fs_{out}$, $2*Fs_{out}$, $4*Fs_{out}$, and $8*Fs_{out}$. Decimation filter 150 may contain three separate halfband filters, 160, 162, and 164. The configuration of decimation filter 150 with the 1-2-4-8× decimation engine may provide that when $Fs_{in}$ is larger than $Fs_{out}$, the passband of $Fs_{in}$ does not fold back as noise in the passband of $Fs_{out}$.

In an example embodiment, the input signal with a sampling rate of $8*Fs_{out}$ may be input from FIFO 124 to HB filter 160. HB filter 160 may filter the signal at the $8*Fs_{out}$ sampling rate and may cut the sampling rate in half, thus outputting a signal to logic gate 170 with a sampling rate of $4*Fs_{out}$. Logic gate 170 may receive $D_{in}$ at a sampling rate of $4*Fs_{out}$ from rate converter 120, and may receive the outputted signal from HB filter 160 (also operating at $4*Fs_{out}$). Adaptive decimation rate controller 140 may determine which signal is outputted form logic gate 170 by selectably controlling the logic gate. Adaptive decimation rate controller 140 may also selectably control logic gates 172 and 174. Adaptive decimation rate controller 140 may determine which input to logic gate 170 should be output to HB filter 162. The output signal, received by HB filter 162, may have a sampling rate of $4*Fs_{out}$. This signal may be filtered by HB filter 162, which may output a signal to logic gate 172.

HB filter 162 may cut the sampling rate of the $4*Fs_{out}$ signal in half, thus outputting a signal to logic gate 172 with a sampling rate of $2*Fs_{out}$. Logic gate 172 may receive $D_{in}$ at a sampling rate of $2*Fs_{out}$ from rate converter 120, and may receive the outputted signal from HB filter 162 (also operating at $2*Fs_{out}$). Again, adaptive decimation rate controller 140 may selectably control logic gate 172 to determine whether the signal from the rate converter 120 or the signal from HB filter 162, is output to HB filter 164. The determined signal is output to HB filter 164 at a sampling rate of $2*Fs_{out}$.

HB filter 164 may receive $D_{in}$ at a sampling rate of two times the output sampling rate. HB filter 164 may cut this sampling rate in half, thus outputting a signal to logic gate 174 that has a sampling rate equal to $Fs_{out}$, the output sampling rate. Logic gate 174 may also receive $D_{in}$ at a sampling rate of $Fs_{out}$ from rate converter 120. Adaptive decimation rate controller 140 may selectably control logic gate 174 to determine whether the signal from the rate converter 120 or the signal from HB filter 1642, is output. The output of control logic gate 174 may be the output of the decimation filter 150, and may output the input data at $Fs_{out}$.

ASRC 100 may also include adaptive decimation rate controller 140. The adaptive decimation rate controller 140 may use the ratio of the input sampling rate to the output sampling rate, as determined by DPLL 130, to determine the decimation rate of the decimation filter 150. The adaptive decimation rate controller 140 may use a hysteresis algorithm to determine the decimation rate of filter 150. Adaptive decimation rate controller 140 may be integrated with the decimation engine in decimation filter 150.

Figure 5:
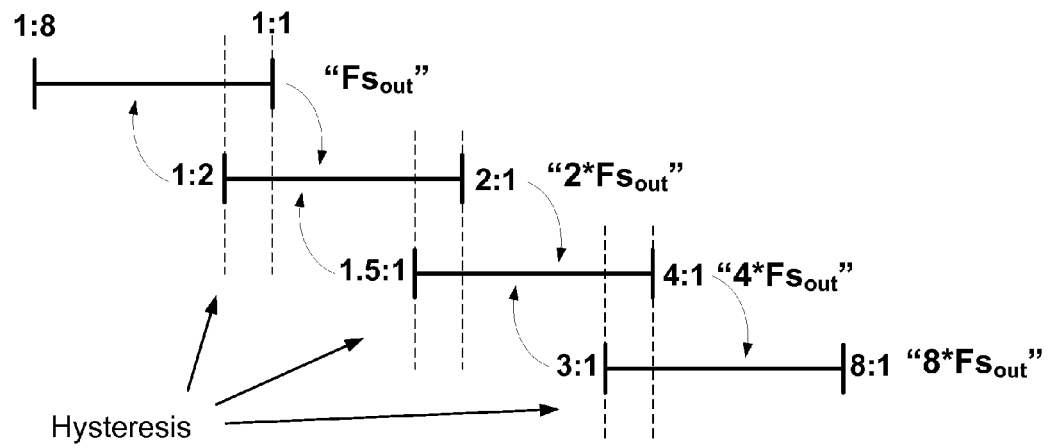
FIG. 5 is a graph of the classification for decimation ratios made by the hysteresis algorithm of the adaptive decimation rate controller based on the $Fs_{in}/Fs_{out}$ ratio.

The adaptive decimation rate controller 140 may use a hysteresis algorithm to selectably control the logic gates 170, 172, and 174, in the decimation filter 150. FIG. 5 illustrates a classification for decimation ratios made by the hysteresis algorithm based on the $Fs_{in}/Fs_{out}$ ratio. In an example embodiment, the $Fs_{in}/Fs_{out}$ ratio may be $\leq 1$. In this embodiment, a decimation rate of 1 may be chosen for the decimation filter. In this embodiment, adaptive decimation rate controller 140 may selectably control logic gate 174 to output the input signal $D_{in}$ at a sampling rate of $Fs_{out}$ that was transmitted to the filter from rate converter 120. Logic gates 170 and 172 may be selectively controlled not to output any signal, and HB filters 160, 162, and 164 may be shut off. Logic gate 174 may output $D_{in}$ at a sampling rate of $Fs_{out}$ as the output of decimation filter 150.

In an embodiment, the $Fs_{in}/Fs_{out}$ ratio determined by DPLL 130 may be greater than 1, but less than or equal to 2 ($1<ratio\leq 2$). In this embodiment, a decimation rate of 2 may be chosen for decimation filter 150. In this embodiment, adaptive decimation rate controller 140 may selectably control logic gate 172 to output the input signal $D_{in}$ at a sampling rate of $2*Fs_{out}$ that was transmitted to the logic gate from rate converter 120. Logic gate 172 may transmit this signal to HB filter 164. HB filter 164 may receive $D_{in}$ at a sampling rate of $2*Fs_{out}$. HB filter 164 may cut the sampling rate of the signal in half and may output $D_{in}$ at a sampling rate of $Fs_{out}$ to logic gate 174. Logic gate 174 may output $D_{in}$ at a sampling rate of $Fs_{out}$ as the output of decimation filter 150. Logic gates 170 may be selectively controlled not to output any signal to HB filter 162, and HB filters 160 and 162 may be shut off, as these filters are bypassed by the incoming signal to logic gate 172.

In an embodiment of the present invention, the $Fs_{in}/Fs_{out}$ ratio may be greater than 2, but less than or equal to 4 ($2<ratio\leq 4$). In this embodiment, a decimation rate of 4 may be chosen for decimation filter 150. In this embodiment, adaptive decimation rate controller 140 may selectably control logic gate 170 to output the input signal $D_{in}$ at a sampling rate of $4*Fs_{out}$ that was transmitted to the logic gate from rate converter 120. Logic gate 170 may transmit this signal to HB filter 162. HB filter 162 may receive $D_{in}$ at a sampling rate of $4*Fs_{out}$. HB filter 162 may cut the sampling rate of the signal in half and may output $D_{in}$ at a sampling rate of $2*Fs_{out}$ to logic gate 172. Logic gate 172 may selectably transmit this signal to HB filter 164, rather than transmitting the signal directly received by logic gate 172 from rate converter 120. HB filter 164 may receive $D_{in}$ at a sampling rate of $2*Fs_{out}$. HB filter 164 may cut the sampling rate of the signal in half and may output $D_{in}$ at a sampling rate of $Fs_{out}$ to logic gate 174. Logic gate 174 may output $D_{in}$ at a sampling rate of $Fs_{out}$ as the output of decimation filter 150. HB filter 160 may be shut off, as this filter may be bypassed by the incoming signal to logic gate 170.

In an example embodiment, the $Fs_{in}/Fs_{out}$ ratio may be greater than 4, but less than or equal to 8 ($4<ratio\leq 8$). In this embodiment, a decimation rate of 8 may be chosen for the decimation filter. In this embodiment, $D_{in}$ may be directly output to decimation filter 150 from rate converter 120 at a sampling rate of $8*Fs_{out}$. This received input may be transmitted to HB filter 160. HB filter 160 may cut the sampling rate of the received signal in half and may output a signal to logic gate 170 with a sampling rate of $4*Fs_{out}$. Logic gate 170 may be selectably controlled by adaptive decimation rate controller 140 to transmit this signal to HB filter 162. Logic gate 170 may not output the signal directly received by logic gate 170 from rate converter 120.

HB filter 162 may receive $D_{in}$ at a sampling rate of $4*Fs_{out}$. HB filter 162 may cut the sampling rate of the signal in half and may output $D_{in}$ at a sampling rate of $2*Fs_{out}$ to logic gate 172. Logic gate 172 may selectably transmit this signal to HB filter 164, rather than transmitting the signal directly received by logic gate 172 from rate converter 120. HB filter 164 may receive $D_{in}$ at a sampling rate of $2*Fs_{out}$. HB filter 164 may cut the sampling rate of the signal in half and may output $D_{in}$ at a sampling rate of $Fs_{out}$ to logic gate 174. Logic gate 174 may output $D_{in}$ at a sampling rate of $Fs_{out}$ as the output of decimation filter 150.

In an embodiment where the ratio of $Fs_{in}/Fs_{out}$ is greater than 8, a decimation rate of 8 may be still be used, and $D_{in}$ may be input to decimation filter 150 at a sampling rate of $8*Fs_{out}$. In this embodiment, a process identical to performing downsampling at a decimation rate of 8, as described above, may be used.

The system may adaptively change the decimation rate according to a change in the $Fs_{in}/Fs_{out}$ rate, but may avoid changing the decimation rate when the ratio is close to 1, 2, 4 or 8. This may allow for a significant savings in power consumption. Power may also be saved by shutting down various stages of the decimation filter 150, such as the logic gates or halfband filters, when these components are bypassed. These stages may also be shut down if $Fs_{in}$ is less than $Fs_{out}$, which may bypass the filter system through logic gate 174. The ASRC of the present invention may save over 50% in both area and power than previously constructed ASRCs.

To ensure that the asynchronous sample rate converter operates as desired, the desired output re-sampling point may need to be measured as a fraction of the input sampling time grid to a determined accuracy. This may be done by calculating the ratio $Fs_{in}/Fs_{out}$ to an accuracy of about 20 bits. This ratio may then be integrated with itself to generate an output-request time stamp. DPLL 130 may be designed to operate using low power consumption, and may calculate the $Fs_{in}/Fs_{out}$ ratio while simultaneously rejecting as much jitter as possible on both the $Fs_{in}$ and $Fs_{out}$ clocks.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. An asynchronous sample rate converter, the converter comprising:
    an arrangement for determining a ratio of an input sampling rate to an output sampling rate;
    an interpolation filter that upsamples an input signal having the input sampling rate;
    a rate converter including an interpolator, the rate converter receiving and converting the upsampled input signal to produce a rate converter signal having a sampling rate that is a multiple of the output sampling rate;
    a controller using a hysteresis algorithm to determine a decimation rate based on the ratio of the input sampling rate to the output sampling rate; and
    a decimation filter selectably controlled by the controller to downsample the rate converter signal based on the determined decimation rate to produce an output signal having the output sampling rate.

2. The converter according to claim 1, wherein the decimation filter includes a plurality of logic gates to receive the rate converter signal at a set of sampling rates of different multiples of the output sampling rate, outputs of the logic gates being selectably controlled by the controller based on the determined decimation rate.

3. The converter according to claim 2, wherein the decimation filter includes a plurality of halfband filters, the halfband filters alternately being connected in series with the logic gates, wherein each of the halfband filters is connected to another through one of the logic gates.

4. The converter according to claim 3, wherein each of the logic gates is selectably controlled to output either an input from a connected halfband filter or one of the sampling rates from the set of sampling rates based on the determined decimation rate.

5. The converter according to claim 3, wherein each of the logic gates outputs a signal to another connected halfband filter.

6. The converter according to claim 3, wherein a lowest order logic gate outputs the input signal at the output sampling rate.

7. The converter according to claim 3, wherein only one of the logic gates outputs one of the sampling rates from the set of sampling rates.

8. The converter according to claim 7, wherein if a lower order logic gate outputs one of the sampling rates from the set of sampling rates, a higher order logic gate is shut off.

9. The converter according to claim 3, wherein each of the halfband filters outputs an output signal to a connected logic gate, the output signal having a lower sampling rate than an input to the respective halfband filter.

10. The converter according to claim 9, wherein a highest order halfband filter receives an input directly from the rate converter.

11. The converter according to claim 1, wherein the interpolator in the rate converter further upsamples the interpolated input signal.

12. The converter according to claim 1, wherein the arrangement includes a digital phase-locked loop.

13. The converter according to claim 1, wherein the decimation filter is a finite impulse response filter (FIR).

14. The converter according to claim 1, wherein the interpolation filter is a multi-stage FIR.

15. The converter according to claim 14, wherein the interpolation filter includes a cascaded integrator-comb filter and a halfband filter.

16. A method of performing an asynchronous sample rate conversion, the method comprising:
    determining a ratio of an input sampling rate to an output sampling rate;
    upsampling an input signal having the input sampling rate by an interpolation filter;
    converting, by a rate converter, the upsampled input signal to a rate converter signal having a sampling rate that is a multiple of the output sampling rate;
    determining, by a controller, a decimation rate based on the ratio of the input sampling rate to the output sampling rate;
    selectably controlling an input to a decimation filter based on the determined decimation rate; and
    downsampling, by the decimation filter, the rate converter signal based on the determined decimation rate to produce an output signal having the output sampling rate.

17. The method according to claim 16, further comprising:
    shutting off logic in the decimation filter not used to downsample the determined sample rate.

18. The method according to claim 16, further comprising:
    downsampling by at least one halfband filter in the decimation filter.

19. The method according to claim 16, further comprising:
    receiving, by a plurality of logic gates, the upsampled input signal at a set of sampling rates of different multiples of the output sampling rate; and
    selectably controlling, by the controller, outputs of the logic gates based on the determined decimation rate.

20. The method according to claim 19, wherein each of the logic gates is selectably controlled to output either an input from a connected halfband filter or one of the sampling rates from the set of sampling rates based on the determined decimation rate.

21. An asynchronous sample rate converter, comprising:
    an interpolation filter to upsample an input signal, having an input sampling rate, to produce an upsampled input signal;
    a rate converter to receive and convert the upsampled input signal to produce a rate converter signal having a sampling rate that is a multiple of an output sampling rate; and
    a decimation filter to downsample the rate converter signal to produce an output signal, having the output sampling rate, using a decimation rate based on a ratio of the input sampling rate to the output sampling rate.

* * * * *